(12) United States Patent
Ho

(10) Patent No.: US 8,065,468 B2
(45) Date of Patent: Nov. 22, 2011

(54) DATA STORING METHODS AND APPARATUS THEREOF

(75) Inventor: Kunlin Ho, Hsinchu County (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 496 days.

(21) Appl. No.: 12/402,657

(22) Filed: Mar. 12, 2009

(65) Prior Publication Data

US 2010/0005230 A1    Jan. 7, 2010

Related U.S. Application Data

(60) Provisional application No. 61/077,884, filed on Jul. 3, 2008.

(30) Foreign Application Priority Data

Nov. 25, 2008 (TW) ................................ 97145451 A

(51) Int. Cl.
*G06F 13/00* (2006.01)
(52) U.S. Cl. ........................................ 711/103; 711/154
(58) Field of Classification Search .................. 711/103, 711/154
See application file for complete search history.

(56) References Cited

U.S. PATENT DOCUMENTS

2010/0169547 A1 * 7/2010 Ou ................................. 711/103

FOREIGN PATENT DOCUMENTS

| CN | 1703678 | 11/2005 |
|----|---------|---------|
| CN | 101194238 | 6/2008 |

OTHER PUBLICATIONS

PCT Search Report mailed Oct. 1, 2009.
English abstract of CN101194238.
English abstract of CN1703678.

* cited by examiner

*Primary Examiner* — Reba I. Elmore
(74) *Attorney, Agent, or Firm* — Thomas|Kayden

(57) ABSTRACT

A data storing method for non-volatile memory is provided, wherein the non-volatile memory includes at least one memory block having a plurality of strong pages and weak pages. A logic block writing command is received for storing the corresponding writing data into the memory block. It is then determined whether the writing data is larger than one page. The writing data is divided into a plurality of page data according to the memory size of the page when the writing data is larger than one page. Next, a first storing page for each page data is determined according to a starting writing page according to the logic block writing command. And, the page data are sequentially written into the first storing pages. Note that each first storing page is a strong page within the memory block.

20 Claims, 7 Drawing Sheets

| Original Storing Page | Corresponding Storing Page | Original Storing Page | Corresponding Storing Page | Original Storing Page | Corresponding Storing Page |
|---|---|---|---|---|---|
| 0 | 0 | 22 | 42 | 44 | 86 |
| 1 | 1 | 23 | 43 | 45 | 87 |
| 2 | 2 | 24 | 46 | 46 | 90 |
| 3 | 3 | 25 | 47 | 47 | 91 |
| 4 | 6 | 26 | 50 | 48 | 94 |
| 5 | 7 | 27 | 51 | 49 | 95 |
| 6 | 10 | 28 | 54 | 50 | 98 |
| 7 | 11 | 29 | 55 | 51 | 99 |
| 8 | 14 | 30 | 58 | 52 | 102 |
| 9 | 15 | 31 | 59 | 53 | 103 |
| 10 | 18 | 32 | 62 | 54 | 106 |
| 11 | 19 | 33 | 63 | 55 | 107 |
| 12 | 22 | 34 | 66 | 56 | 110 |
| 13 | 23 | 35 | 67 | 57 | 111 |
| 14 | 26 | 36 | 70 | 58 | 114 |
| 15 | 27 | 37 | 71 | 59 | 115 |
| 16 | 30 | 38 | 74 | 60 | 118 |
| 17 | 31 | 39 | 75 | 61 | 119 |
| 18 | 34 | 40 | 78 | 62 | 122 |
| 19 | 35 | 41 | 79 | 63 | 123 |
| 20 | 38 | 42 | 82 | | |
| 21 | 39 | 43 | 83 | | |

FIG. 3

DATA STORING METHODS AND APPARATUS THEREOF

CROSS REFERENCE TO RELATED APPLICATIONS

This application claims priority of U.S. Provisional Application No. 61,077,884, filed on Jul. 3, 2008, the entirety of which is incorporated by reference herein.

This application claims priority of Taiwan Patent Application No. 097145451, filed on Nov. 25, 2008, the entirety of which is incorporated by reference herein.

BACKGROUND OF THE INVENTION

1. Field of the Invention

The invention relates to flash memory, and more particularly to a data storing method and apparatus for multi-level cell (MLC) flash memories.

2. Description of the Related Art

Non-volatile memory, such as a NAND flash memory, which has the advantages of a speedy programming time, a small chip area and low power consumption, commonly serve as storage media for various kinds of multimedia data, e.g., secure digital (SD) cards or compact flash (CF) cards.

In general, a NAND flash memory may comprise a single-level cell (SLC) flash memory and a multi-level cell (MLC) flash memory, wherein each single-level cell may store two values '0' and '1' and each multi-level cell may store four values, such as '00', '01', '10' and '11', thus allowing for higher storage density. However, compared with the single-level cell flash memory, the multi-level cell flash memory disadvantageously involves a low data transfer rate and is subject to data corruption and data loss.

Therefore, it is desirable to provide a data storing method capable of solving the problems due to data loss induced by the multi-level cell flash memory and further improving the reliability of data retention.

BRIEF SUMMARY OF THE INVENTION

The invention provides a data storing method for a non-volatile memory having at least one memory block. In an embodiment, the non-volatile memory is a NAND flash memory and the memory block is a multi-level cell memory block. The memory block comprises a plurality of pages and the pages comprise a plurality of strong pages and a plurality of weak pages. The method comprises the steps of: receiving a logic block writing command for storing corresponding writing data into the memory block; determining whether the writing data is larger than one page; dividing the writing data into a plurality of page data according to the memory size of the page when the writing data is larger than one page; obtaining a plurality of first storing pages for each page data according to a starting writing page corresponding to the logic block writing command; and sequentially writing the page data into the first storing pages, wherein each of the first storing pages is a strong page within the memory block.

In addition, the invention provides a data storing apparatus comprising a non-volatile memory and a controller. The non-volatile memory comprises at least one memory block. In an embodiment, the non-volatile memory is a NAND flash memory and the memory block is a multi-level cell memory block. The memory block comprises a plurality of pages and the pages comprise a plurality of strong pages and a plurality of weak pages. The controller is coupled the non-volatile memory for receiving a logic block writing command from a host, determining whether the writing data corresponding to the logic block writing command is larger than one page, dividing the writing data larger than one page into a plurality of page data according to the memory size of the page, obtaining a plurality of first storing pages for each page data according to a starting writing page corresponding to the logic block writing command, and sequentially writing the page data into the first storing pages, wherein each of the first storing pages is a strong page in the memory block.

In addition, the invention provides a data storing method for a non-volatile memory. In an embodiment, the non-volatile memory is a NAND flash memory having at least one memory block, the memory block comprises a plurality of pages, and the pages comprise a plurality of strong pages and a plurality of weak pages. First, a first writing command, a first starting address and writing data are received. The writing data is divided into a plurality of page data according to the first starting address and the length of the writing data, wherein the page data corresponds to a plurality of first storing pages. Next, the first storing pages are converted into a plurality of second storing pages. Afterwards, a plurality of second writing commands, a plurality of second starting address for the second storing pages and the page data are transmitted to the non-volatile memory for data writing. Note that the second storing pages are strong pages.

In addition, the invention provides a data storing method for a non-volatile memory. In an embodiment, the non-volatile memory is a NAND flash memory having at least one memory block, the memory block comprises a plurality of pages and the pages comprise a plurality of strong pages and a plurality of weak pages. The method comprises the steps of receiving a writing command and writing data; dividing the writing data into a plurality of page data; and writing the page data sequentially into the strong pages within the memory block of the non-volatile memory.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3 shows a Mapping Table according to an embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
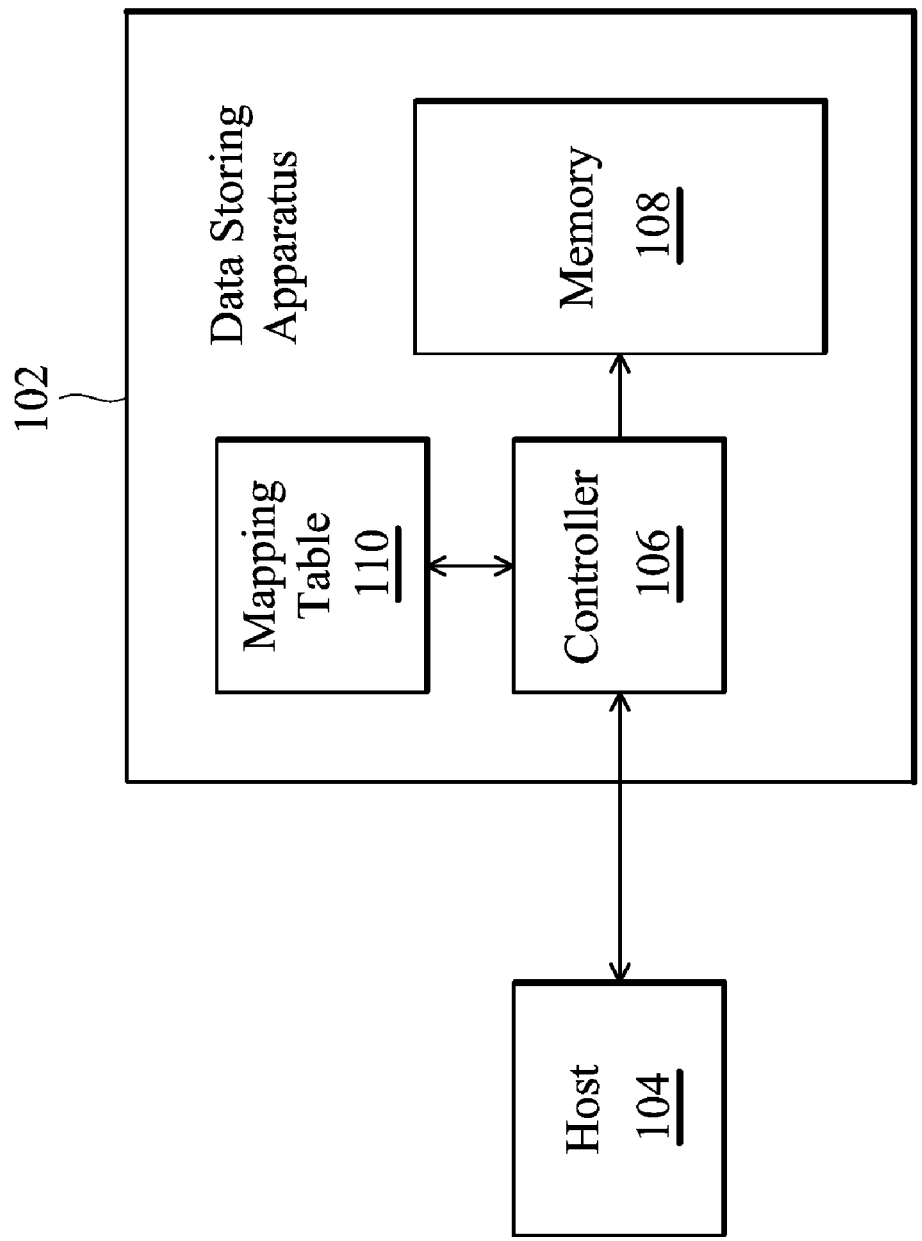
FIG. 1 shows a data storing apparatus and a host according to an embodiment of the invention.

FIG. 1 shows a data storing apparatus 102 and a host 104 according to an embodiment of the invention. In an embodiment, the data storing apparatus 102 is a memory card or a solid state disk (SSD), and the host 104, e.g., a digital camera or a cell phone, stores data into the data storing apparatus 102, or reads data from the data storing apparatus 102 via an interface of universal serial bus (USB), personal computer memory card international association (PCMCIA), serial advanced technology attachment (SATA), or the like. The data storing apparatus 102 comprises a controller 106 and a memory 108. According to an embodiment, the memory 108 is a non-volatile memory, such as a NAND flash memory embodied with several memory blocks as shown in FIG. 2.

Figure 2:
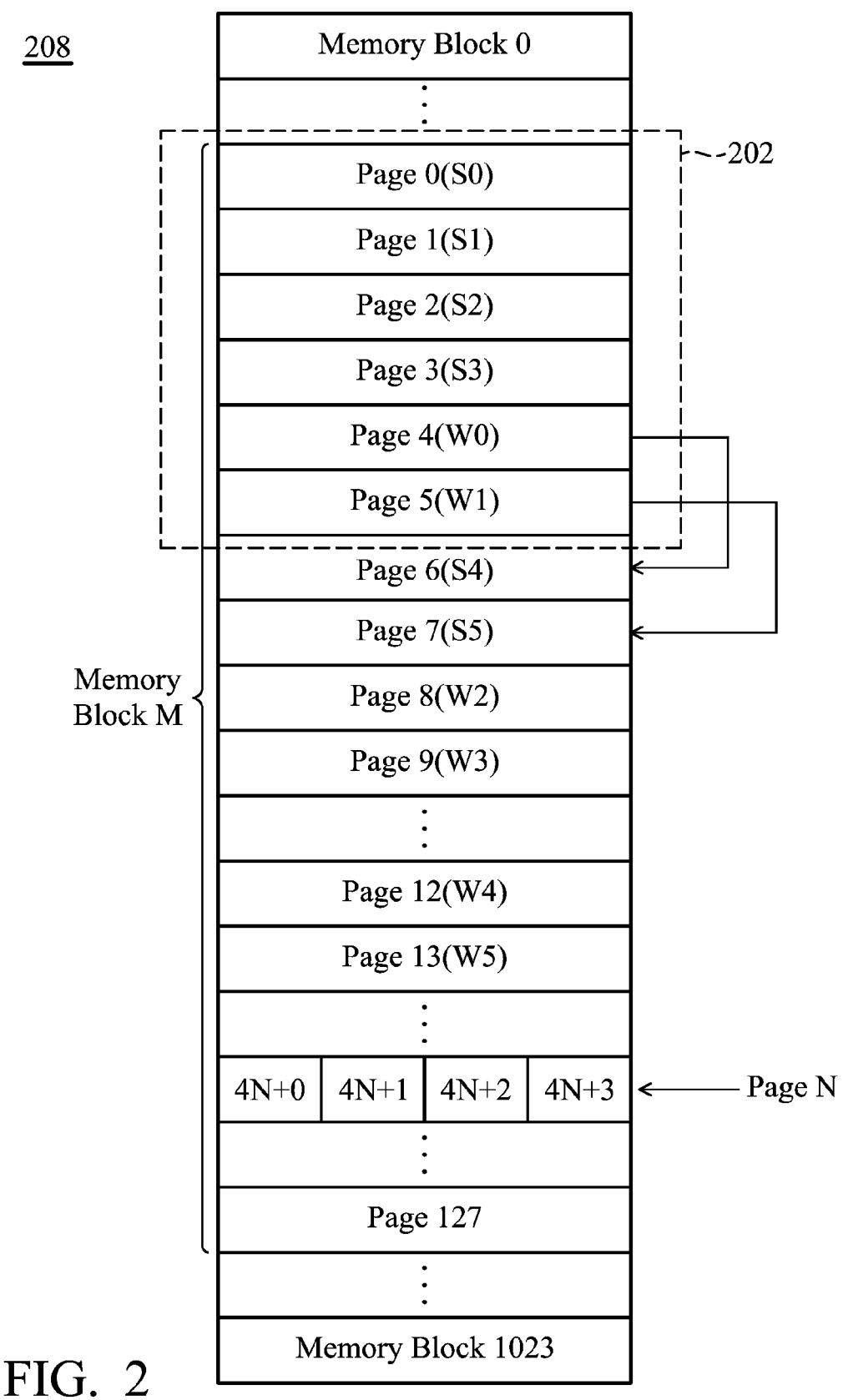
FIG. 2 is a schematic diagram showing a non-volatile memory having several multi-level cell memory blocks according to an embodiment of the invention.

FIG. 2 is a schematic diagram showing a non-volatile memory 208 having several multi-level cell memory blocks according to an embodiment of the invention. In an embodiment, the memory 208 comprises 1024 multi-level cell memory blocks. For each memory block, such as Memory Block M, 128 pages are allocated. For each page, such as Page N, 4 sectors are included, e.g., 4N+0, 4N+1, 4N+2, and 4N+3. Note that M is an integer between 0 and 1023 and N is an integer between 0 and 63. According to an embodiment, each sector is a unit of 512 bytes in memory size for data storing operation.

For a multi-level cell memory block, such as Memory Block M in FIG. 2, each page is classified as a strong page or a weak page. Specifically, the reliability of data stored in the weak page is easily affected by some environment factors, such as temperature or humidity. Further, compared with the weak page, the strong page is more reliable for a lower fault rate of erroneous data. Thus, important data or files should preferably avoid being stored in the weak page for preventing erroneous data or missing data. Moreover, the strong page is the page that requires less programming busy time for writing data and the weak page is the page that requires more programming busy time for writing data.

Generally, strong pages and weak pages are alternately arranged on the basis of a predetermined order. For example, in the Memory Block M, Page 0 to Page 3 are strong pages, Page 4 and Page 5 are weak pages, Page 6 and Page 7 are strong pages, Page 8 and Page 9 are weak pages . . . Page 12 and Page 13 are weak pages, and so on. Additionally, for each memory block, each strong page corresponds to a weak page. Referring to FIG. 2, for the Memory Block M, page 0 is a strong page (represented by S0) corresponding to weak Page 4 (represented by W0), Page 1 is a strong page (represented by S1) corresponding to weak Page 5 (represented by W1), and so on. The operations of storing data into strong pages and weak pages within the multi-level cell memory blocks are described below in detail with reference to FIG. 1 and FIG. 2.

According to the embodiment of FIG. 1, the controller 106 is coupled to the host 104 and the memory 108 for receiving a logic block writing command from the host 104. For example, according to an embodiment, when the host 104 attempts to store a system file 202 into the memory 108, the controller 106 acquires the corresponding writing data (i.e., the system file 202) and a starting logic block address (LBA) according to the logic block writing command. In other embodiments, the logic block writing command may comprise the number of logic blocks for storing the writing data. The starting logic block address is provided to correspond to a sector of a memory block, e.g., sector 4N+2, and determining a starting writing page, such as Page N of the Memory Block M as shown in FIG. 2.

Afterwards, the controller 106 determines whether the writing data is larger than one page. According to the aforementioned embodiment, assuming that 6 pages are required to store the system file 202 and the starting writing page is Page 0, the controller 106 divides the system file 202 into a plurality of serial page data according to memory size of each page, e.g., 2K bytes. Then, the controller 106 obtains an original storing page corresponding to each page data according to the starting writing page (Page 0). As shown in FIG. 2, the system file 202 is sequentially stored into Page 0, Page 1 . . . and Page 5 without separating the strong pages and the weak pages. The controller 106 generates a plurality of page writing commands for performing a sequential write operation according to each page data and the corresponding original storing page.

Further, prior to performing the sequential write operation, the strong pages corresponding to each original storing page need to be determined for assuring that the system file 202 can be entirely stored in the strong pages.

In an embodiment, the controller 106 may obtain the strong pages corresponding to Page 0 to Page 5 by a corresponding Formula represented by $$X_{STRONG} = \begin{cases} X_{ORIGINAL}, & \text{when} \quad X_{ORIGINAL} = 0 \\ X_{ORIGINAL} + \left|\left|\frac{X_{ORIGINAL}}{2} - 1\right|\right| \times 2, & \text{when} \quad 1 \leq X_{ORIGINAL} \leq 63, \end{cases} \quad (1)$$

where $X_{ORIGINAL}$ represents an original storing page to be converted and $X_{STRONG}$ represents a converted strong page.

For example, it is assumed that Page 4 in FIG. 2 needs to be converted (i.e., $X_{ORIGINAL}=4$), then the strong page corresponding to Page 4 is determined to be Page 6 (i.e., $X_{STRONG}=6$) by calculating the corresponding Formula (1) as described above. Similarly, via the aforementioned Formula corresponding (1), Page 7 is the strong page corresponding to Page 5. After obtaining the corresponding strong pages, the controller 106 stores the page data in Page 6 and Page 7, respectively, rather in Page 4 and Page 5.

Note that when the system file 202 has been stored and the host 104 attempts to write other data to the same Memory Block M, the host 106 may further use the aforementioned corresponding Formula (1) to convert each original storing page to a corresponding strong page for performing the write operation.

Additionally, according to another embodiment, the data storing apparatus 102 further comprises a Mapping Table 110 for mapping each original storing page to a strong page in the memory block.

FIG. 3 shows a Mapping Table 110 according to an embodiment of the invention. Referring to FIG. 3, since strong pages and weak pages are alternately arranged, for a memory block consisting of 128 pages, the number of available strong pages is equal to the half number of total pages. In operation, the controller 106 may obtain the strong pages (denoted by corresponding storing page in FIG. 3) corresponding to each original storing page by looking up the Mapping Table 110. According to the Mapping Table 110 in FIG. 3, the corresponding strong page of Page 4 is directly determined to be Page 6 and the corresponding strong page of Page 5 is determined to be Page 7.

It is noted that the Mapping Table is generated by the aforementioned corresponding Formula (1).

Moreover, when the controller 106 receives a logic block writing command from the host 104 and determines that the writing data corresponding to the logic block writing command is less than one page, the corresponding strong page for the starting writing page may be obtained by the aforementioned corresponding Formula (1) or the Mapping Table 110, so as to store the writing data to the corresponding strong page.

Figure 4:
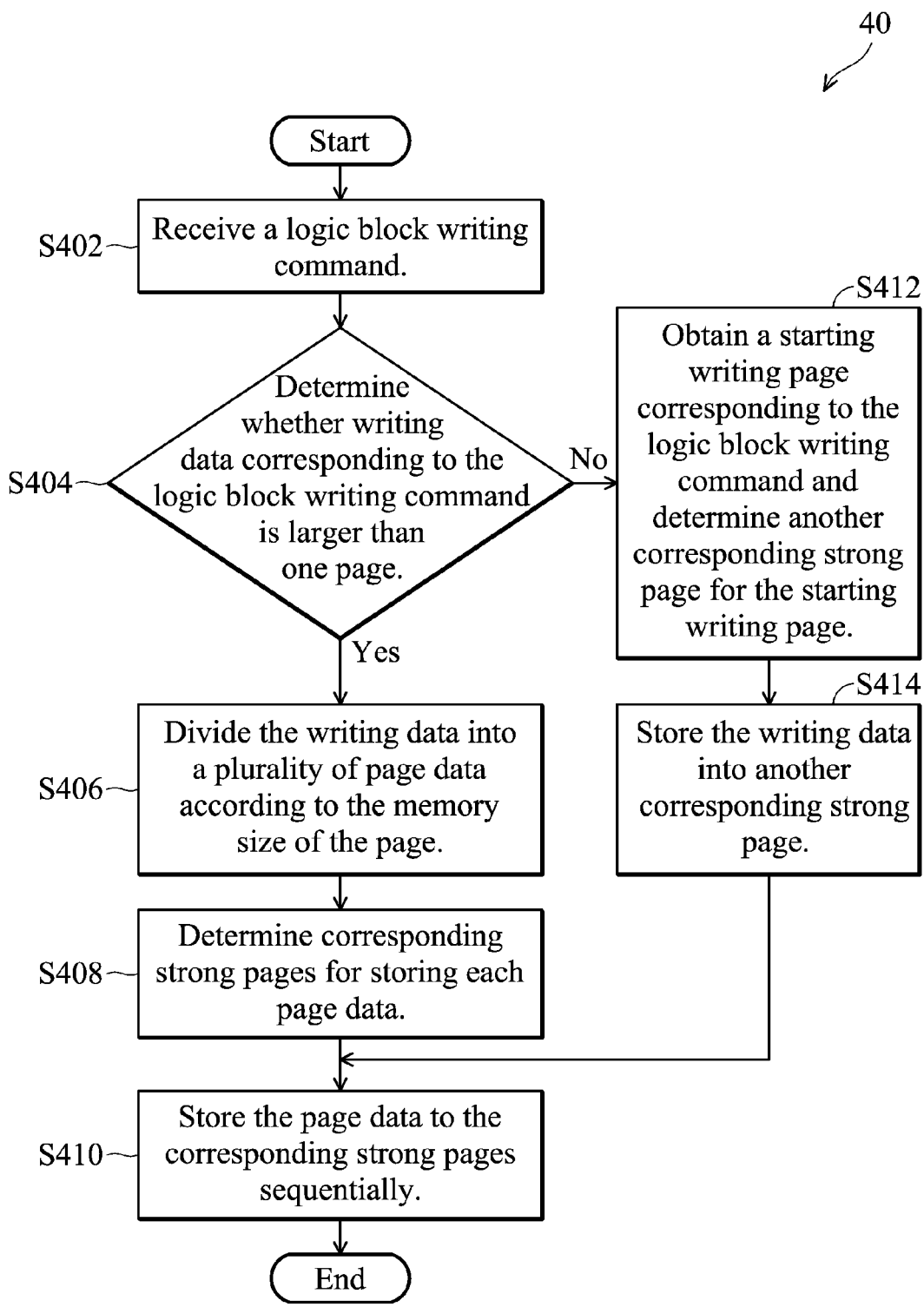
FIG. 4 is a flowchart showing a data storing method according to an embodiment of the invention.

FIG. 4 is a flowchart showing a data storing method 40 according to an embodiment of the invention. As described above, the data storing method is used for a non-volatile memory, such as a NAND flash memory. The flash memory includes several memory blocks, e.g., multi-level cell memory blocks. Each memory block, such as Memory Block M as shown in FIG. 2, is composed of a plurality of pages having a plurality of strong pages and a plurality of weak pages.

First, the controller 106 receives a logic block writing command from the host 104 for storing the writing data corresponding to the logic block writing command to the memory block (step S402). In one embodiment, the writing data is the system file 202 as shown in FIG. 2. Next, the controller 106 determines whether the writing data is larger than one page (step S404).

When the writing data is larger than one page, the writing data is divided into a plurality of page data according to the memory size of the page (step S406), e.g., Page 0, Page 1 . . . and Page 5 in FIG. 2. Subsequently, according to a starting writing page corresponding to the logic block writing command, the controller 106 obtains a first storing page for each page data. More specifically, the controller 106 determines the corresponding strong pages for each page data (step S408). The process for obtaining a corresponding strong page is described in detail in the embodiments associated with FIGS. 1, 2 and 3, and hence, further description thereof is omitted for brevity. When the corresponding strong pages for each page data are obtained, the page data is sequentially written to the corresponding strong pages (step S410).

When the writing data is less than one page, the controller 106 obtains a starting writing page corresponding to the logic block writing command and determines another corresponding strong page for the starting writing page (step S412). Then, the controller 106 stores the writing data into another corresponding strong page (step S414).

Figure 5:
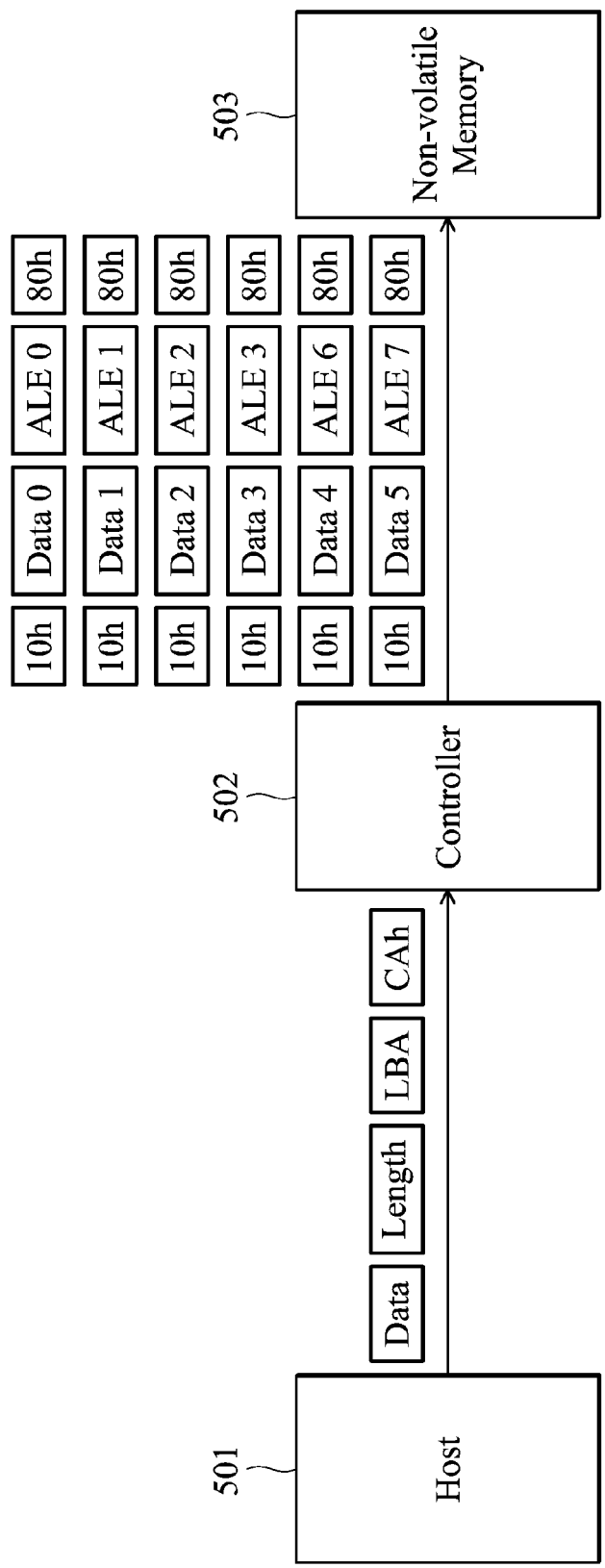
FIG. 5 is a flowchart showing a data storing method according to another embodiment of the invention.

FIG. 5 is a flowchart showing a data storing method according to another embodiment of the invention. According to this embodiment, the data is entirely stored in the corresponding strong pages via the conversion of the controller 502. The detailed description is illustrated below in detail with reference to FIG. 6.

Figure 6:
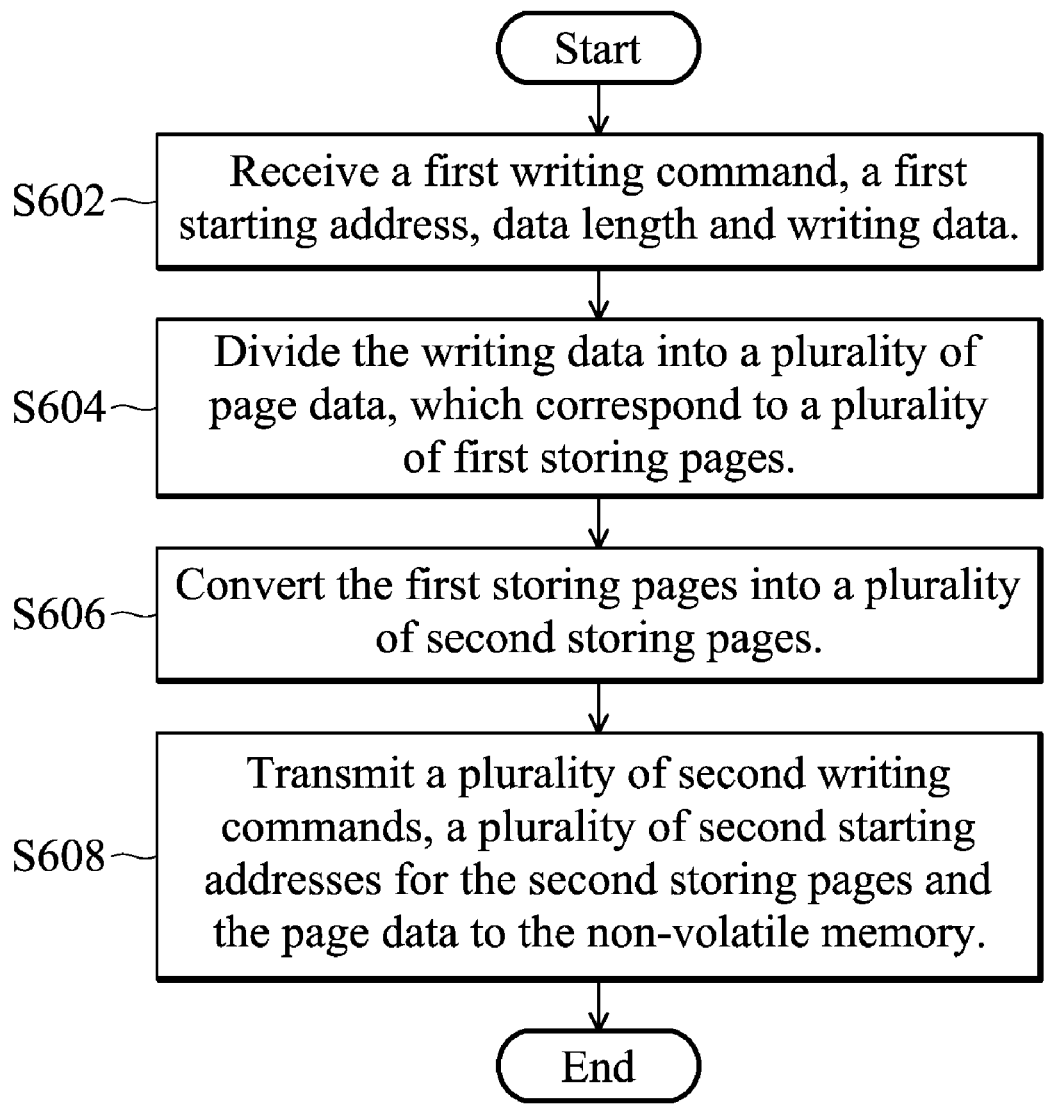
FIG. 6 is a flowchart showing a data storing method according to still another embodiment of the invention.

FIG. 6 is a flowchart showing a data storing method according to still another embodiment of the invention. Referring to FIG. 2, first, the controller 502 receives a first writing command CAh, a first starting address LBA, a data length Length and writing data Data (step S602). Afterwards, the writing data is divided into a plurality of page data according to the first starting address LBA and the length of the writing data Length, wherein the page data corresponds to a plurality of first storing pages (step S604), e.g., Page 0 to Page 5 in FIG. 2. The controller 502 subsequently converts the first storing pages (Page 0, Page 1, Page 2, Page 3, Page 4 and Page 5) into a plurality of second storing pages (Page 0, Page 1, Page 2, Page 3, Page 6 and Page 7) (step S606) according to the following Formula or the Mapping Table as shown in FIG. 3, $$X_{STRONG} = \begin{cases} X_{ORIGINAL}, & \text{when} \quad X_{ORIGINAL} = 0 \\ X_{ORIGINAL} + \left\lfloor \left| \frac{X_{ORIGINAL}}{2} - 1 \right| \right\rfloor \times 2, & \text{when} \quad 1 \le X_{ORIGINAL} \le 63, \end{cases} \quad (2)$$

wherein $X_{ORIGINAL}$ represents a first storing page and $X_{STRONG}$ represents a corresponding second storing page.

Accordingly, the controller 502 transmits a plurality of second writing commands 80h, a plurality of second starting addresses (i.e., ALE 0, ALE 1 . . . ALE 5) and the page data (i.e., Data 0, Data 1, Data 2, Data 3, Data 4, Data 5) to a non-volatile memory 503 for data writing (step S608). Note that ALE 0 is the starting address of Page 0, ALE 1 is the starting address of Page 1, ALE 2 is the starting address of Page 2, ALE 3 is the starting address of Page 3, ALE 6 is the starting address of Page 6 and ALE 7 is the starting address of Page 7. It is further noted that the page data Data 4 and Data 5 that would be stored in the weak pages such as Page 4 and Page 5 are instead stored in the strong pages, i.e., Page 0-Page 3 and Page 6-Page 7, via the conversion of the controller 502, so as to improve the reliability of data retention that is subjected to the environmental conditions, such as temperature or humidity.

Figure 7:
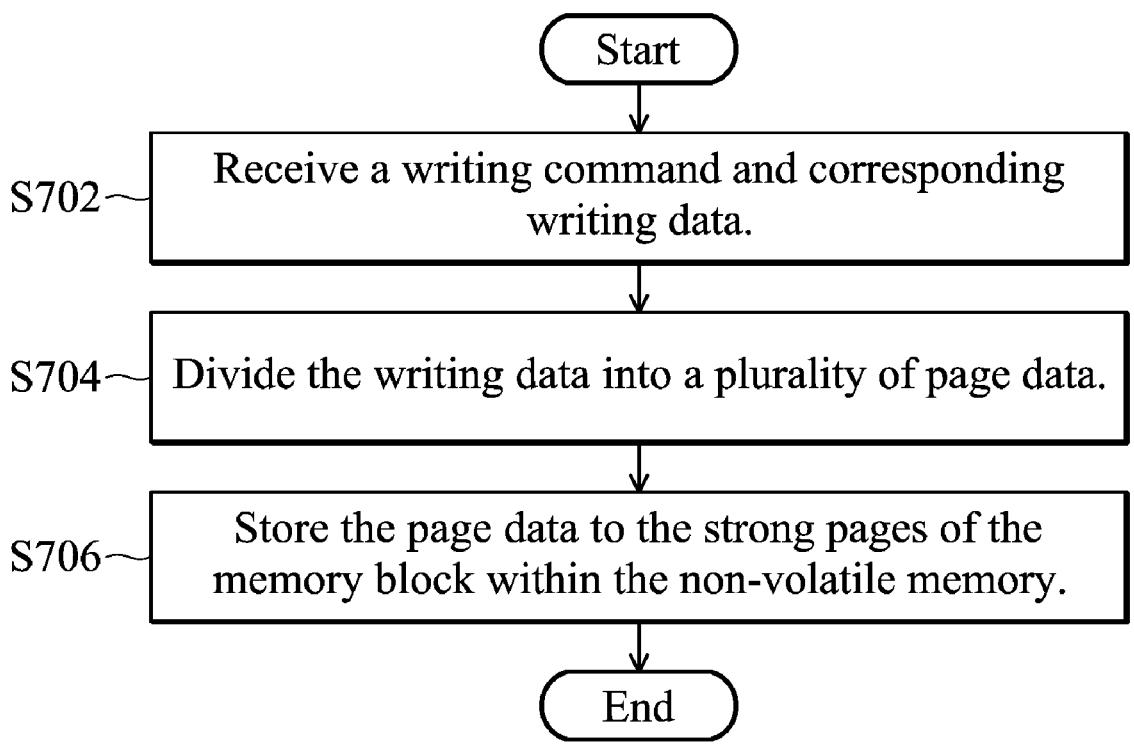
FIG. 7 is a flowchart showing a data storing method according to yet another embodiment of the invention.

FIG. 7 is a flowchart showing a data storing method for storing data into a memory, e.g., the non-volatile memory 208 with the Memory Block M as shown in FIG. 2, according to yet another embodiment of the invention. As described above, the memory 208 comprises a plurality of strong pages and a plurality of weak pages alternately arranged on the basis of a predetermined order. Each weak page corresponds to each strong page. First, a writing command and corresponding writing data are received (step S702). Next, the writing data is divided into a plurality of page data (step S704). Then, each page data is sequentially stored when the page data are obtained. In this embodiment, the page data are specifically written into the strong pages of the Memory Block M within the memory 208 (step S706).

In comparison with the prior art, the data storing apparatus and methods of the invention advantageously allow data to be written into all pages, or alternatively into strong pages of memory blocks by automatically skipping over weak pages, thereby avoiding corruption or loss of data, preserving integrity of the written data and improving stability and reliability for data storing.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A data storing method for a non-volatile memory having at least one memory block, wherein the memory block comprises a plurality of pages and the pages comprise a plurality of strong pages and a plurality of weak pages, comprising:

receiving a logic block writing command for storing corresponding writing data into the memory block;

dividing the writing data into a plurality of page data according the memory size of the page when the writing data is larger than one page;

obtaining a plurality of first storing pages for each page data according to a starting writing page corresponding to the logic block writing command; and writing the page data into the first storing pages sequentially, wherein each of the first storing pages is a strong page in the memory block.

2. The data storing method according to claim 1, wherein the strong pages and the weak pages are alternately arranged on the basis of a predetermined order and wherein each weak page corresponds to each strong page.

3. The data storing method according to claim 1, wherein the conversion by the following Formula is made for determining the first storing page for each page data:

$$X_{STRONG} = \begin{cases} X_{ORIGINAL}, & \text{when} \quad X_{ORIGINAL} = 0 \\ X_{ORIGINAL} + \left\lfloor \left| \frac{X_{ORIGINAL}}{2} - 1 \right| \right\rfloor \times 2, & \text{when} \quad 1 \le X_{ORIGINAL} \le 63, \end{cases}$$

wherein $X_{ORIGINAL}$ represents an original storing page to be converted and $X_{STRONG}$ represents a converted first storing page.

4. The data storing method according to claim 1, wherein the first storing page for each page data is determined by looking up a Mapping Table, wherein the Mapping Table stores an original storing page to be converted and a converted first storing page corresponding to the original storing page.

5. The data storing method according to claim 1, further comprising:

determining a second storing page corresponding to the starting writing page when the writing data is less than one page, wherein the starting writing page corresponds to the logic block writing command; and storing the writing data to the second storing page, wherein the second storing page is a strong page in the memory block.

6. The data storing method according to claim 1, further comprising:

determining whether the writing data is larger than one page.

7. The data storing method according to claim 1, wherein the memory block is a multi-level cell memory block.

8. A data storing apparatus, comprising:

a non-volatile memory having at least one memory block, wherein the memory block comprises a plurality of pages and the pages comprise a plurality of strong pages and a plurality of weak pages; and a controller coupled to the non-volatile memory for receiving a logic block writing command from a host, dividing the writing data larger than one page into a plurality of page data according to the memory size of the page, obtaining a plurality of first storing pages for each page data according to a starting writing page corresponding to the logic block writing command, and sequentially writing the page data into the first storing pages, wherein each of the first storing pages is a strong page in the memory block.

9. The data storing apparatus according to claim 8, wherein the strong pages and the weak pages are alternately arranged on the basis of a predetermined order and wherein each weak page corresponds to each strong page.

10. The data storing apparatus according to claim 8, wherein the conversion by the following Formula is made for determining the first storing page for each page data:

$$X_{STRONG} = \begin{cases} X_{ORIGINAL}, & \text{when} \quad X_{ORIGINAL} = 0 \\ X_{ORIGINAL} + \left\lfloor \left| \frac{X_{ORIGINAL}}{2} - 1 \right| \right\rfloor \times 2, & \text{when} \quad 1 \le X_{ORIGINAL} \le 63, \end{cases}$$

wherein $X_{ORIGINAL}$ represents an original storing page to be converted and $X_{STRONG}$ represents a converted first storing page.

11. The data storing apparatus according to claim 8, wherein the first storing page for each page data is determined by looking up a Mapping Table, wherein the Mapping Table stores an original storing page to be converted and a converted first storing page corresponding to the original storing page.

12. The data storing apparatus according to claim 8, wherein the controller determines a second storing page corresponding to the starting writing page when the writing data is less than one page and stores the writing data into the second storing page, wherein the starting writing page corresponds to the logic block writing command and the second storing page is a strong page in the memory block.

13. The data storing apparatus according to claim 8, wherein the non-volatile memory comprises a NAND flash memory.

14. The data storing apparatus according to claim 8, wherein the controller further determines whether the writing data corresponding to the logic block writing command is larger than one page.

15. A data storing method for a non-volatile memory having at least one memory block, wherein the memory block comprises a plurality of pages and the pages comprise a plurality of strong pages and a plurality of weak pages, comprising:

receiving a first writing command, a first starting address and writing data;

dividing the writing data into a plurality of page data according the first starting address and the length of the writing data, wherein the page data corresponds to a plurality of first storing pages;

converting the first storing pages into a plurality of second storing pages; and transmitting a plurality of second writing commands, a plurality of second starting address for the second storing pages and the page data to the non-volatile memory for data writing, wherein the second storing pages are strong pages.

16. The data storing method according to claim 15, wherein the first storing pages are converted to the second storing pages by the following Formula:

$$X_{STRONG} = \begin{cases} X_{ORIGINAL}, & \text{when} \quad X_{ORIGINAL} = 0 \\ X_{ORIGINAL} + \left\lfloor \left| \frac{X_{ORIGINAL}}{2} - 1 \right| \right\rfloor \times 2, & \text{when} \quad 1 \le X_{ORIGINAL} \le 63, \end{cases}$$

wherein $X_{ORIGINAL}$ represents the first storing page and $X_{STRONG}$ represents the second storing page.

17. The data storing method according to claim 15, wherein each of the second storing page is determined by looking up a Mapping Table, wherein the Mapping Table stores each of the first storing pages to be converted and the second storing pages each corresponding to the first storing pages.

18. A data storing method for a non-volatile memory having at least one memory block, wherein the memory block comprises a plurality of pages and the pages comprise a plurality of strong pages and a plurality of weak pages, comprising:

receiving a writing command and writing data;

dividing the writing data into a plurality of page data; and writing the page data sequentially into the strong pages within the memory block of the non-volatile memory.

19. The data storing method according to claim 18, wherein the strong pages and the weak pages are alternately arranged on the basis of a predetermined order and wherein each weak page corresponds to each strong page.

20. The data storing method according to claim 18, wherein the programming busy time of the strong pages for writing data is less than that of the weak pages.

* * * * *